United States Patent [19]

Lehner et al.

[11] 4,421,840

[45] Dec. 20, 1983

[54] PHOTOPOLYMERIZABLE RECORDING MATERIAL CONTAINING A DIISOCYANATE MODIFIED NYLON BINDER

[75] Inventors: August Lehner, Roedersheim; Heinz U. Werther, Wachenheim; Dieter Naegele, Worms; Werner Lenz, Bad Durkheim; Mong-Jon Jun, Speyer; Horst Reimann, Worms; Albrecht Eckell, Frankenthal, all of Fed. Rep. of Germany

[73] Assignee: Basf Aktiengesellschaft, Fed. Rep. of Germany

[21] Appl. No.: 329,111

[22] Filed: Dec. 9, 1981

[30] Foreign Application Priority Data

Dec. 13, 1980 [DE] Fed. Rep. of Germany ....... 3047126

[51] Int. Cl.³ .............................................. G03C 1/78
[52] U.S. Cl. ................................... 430/273; 430/271; 430/281; 430/283; 430/284; 430/306; 430/906
[58] Field of Search ............... 430/281, 283, 284, 906, 430/306, 271, 273

[56] References Cited

U.S. PATENT DOCUMENTS

| | | | |
|---|---|---|---|
| 2,760,863 | 8/1956 | Plambeck, Jr. ........................ | 95/5.6 |
| 2,824,851 | 2/1958 | Hall .................................... | 260/45.5 |
| 3,060,203 | 10/1962 | Huffman ........................... | 260/397.5 |
| 3,373,075 | 3/1968 | Fekete et al. ....................... | 161/185 |
| 3,509,234 | 4/1970 | Burlant et al. ...................... | 260/853 |
| 3,836,492 | 9/1974 | Watanabe et al. ............. | 260/23 TN |
| 4,145,222 | 3/1979 | Etoh et al. .......................... | 430/281 |
| 4,187,112 | 2/1980 | Etoh et al. .......................... | 430/281 |
| 4,210,713 | 7/1980 | Samiyoshi et al. ................. | 430/284 |
| 4,220,704 | 9/1980 | Etoh et al. .......................... | 430/281 |
| 4,239,609 | 12/1980 | Barzynski et al. ................. | 430/286 |
| 4,292,152 | 9/1981 | Lechthen et al. .................. | 430/281 |

FOREIGN PATENT DOCUMENTS 2759164 12/1977 Fed. Rep. of Germany .
2909992 3/1979 Fed. Rep. of Germany .

*Primary Examiner*—Jack P. Brammer
*Attorney, Agent, or Firm*—Keil & Witherspoon

[57] ABSTRACT

A photopolymerizable recording material for the preparation of relief plates comprises a base and a photopolymerizable layer, which layer contains, as the binder, a substantially linear, high molecular weight, thermoplastic diisocyanate-modified nylon which is solid at room temperature and which possesses quaternary and/or quaternizable nitrogen atoms and also possesses photopolymerizable double bonds in side branches.

5 Claims, No Drawings

PHOTOPOLYMERIZABLE RECORDING MATERIAL CONTAINING A DIISOCYANATE MODIFIED NYLON BINDER

The present invention relates to a photopolymerizable recording material comprising a photopolymerizable layer applied to a base, the said layer comprising a photopolymerizable ethylenically unsaturated compound and a photopolymerization initiator, with or without other conventional additives, and, as the binder, a modified nylon with quaternary and/or quaternizable nitrogen atoms. The invention further relates to processes for the preparation of relief plates, eg. printing plates or photoresists, using this photopolymerizable recording material.

It is known that relief printing plates or photoresists can be prepared photochemically by imagewise exposure of a photopolymerizable layer, applied to a base, by means of a radiation source, in particular actinic light, and developing the exposed photopolymerizable layer by treating it with a solvent in which the unexposed areas of the layer are soluble or at least dispersible, whilst the exposed areas are not. The photopolymerizable layer of such recording materials in general contains low molecular weight photopolymerizable compounds, photoinitiators and a polymeric binder which is also photopolymerizable or photocrosslinkable. The requirements which such photopolymerizable recording materials and in particular the polymeric binder of the photopolymerizable layer have to meet are known from the relevant literature. Nowadays, it is desirable to provide photopolymerizable recording materials which not only possess adequate mechanical properties and printing properties, but can be developed with solvents which do not pollute the environment and are not unpleasant to handle.

In order to arrive at photopolymerizable recording materials which, on the one hand, have good mechanical properties and, on the other hand, can be developed with water or dilute aqueous acids after exposure, German Published Application DAS No. 2,454,676 proposes a photosensitive mixture which contains, as the polymeric binder, a nylon, a polyester or a vinyl polymer possessing quaternary nitrogen groups. A disadvantage of these photosensitive mixtures is that the polymers with quaternary nitrogen groups, employed as the binders, do not contain any polymerizable double bonds in the base polymer and accordingly cannot undergo copolymerization during the photopolymerization. This has an effect on, for example, the reactivity and exposure characteristics of the photosensitive mixtures and on the properties of the recording materials and relief printing plates prepared therefrom. It is true that this disadvantage can to some extent be avoided by quaternizing the polymeric binder with unsaturated photopolymerizable acids, for example acrylic acid or methacrylic acid, thereby forming a base polymer adduct which contains reactive double bonds; in that case, however, the well known adverse features of, for example, acrylic acid or methacrylic acid have to be accepted.

It is an object of the present invention to provide a photopolymerizable recording material, having a nylon-based photopolymerizable layer, which does not exhibit the disadvantages of the prior art recording materials of this type, or does so only to a substantially lesser extent. In particular, it is an object to provide a photopolymerizable recording material which is easily prepared, easily handled even before exposure and easily processable and exhibits a very low skin toxicity and contact toxicity. Further objects of the invention are that this recording material should be suitable for the preparation of relief printing plates and photoresists and should accordingly have good exposure characteristics, high resolution, high mechanical strength and good printing characteristics after exposure and development, and good reusability.

We have found, surprisingly, that these objects are achieved if the photopolymerizable layer of the recording material comprises, as the binder, a substantially linear, high molecular weight, thermoplastic diisocyanate-modified nylon which is solid at room temperature and which possesses photopolymerizable double bonds in side branches, and also possesses quaternary and/or quaternizable nitrogen atoms.

Accordingly, the present invention relates to a photopolymerizable recording material comprising a base A and a photopolymerizable layer B directly or indirectly bonded firmly thereto, with or without a top layer and/or cover sheet C, the photopolymerizable layer B comprising 1. as the polymeric binder, a solvent-soluble, substantially linear, high molecular weight, thermoplastic polymer which is solid at room temperature and which possesses quaternary and/or quaternizable nitrogen atoms,
2. one or more photopolymerizable ethylenically unsaturated compounds and
3. a photopolymerization initiator, with or without
4. other, conventional additives, wherein the polymer, having quaternary or quaternizable nitrogen atoms, which is present as the binder (component B1) in the photopolymerizable layer B is a diisocyanate-modified nylon which additionally possesses photopolymerizable double bonds in side branches.

The invention further relates to specific embodiments of this photopolymerizable recording material, as described in detail below. The invention also relates to processes for the preparation of relief plates, for example of relief printing plates or of photoresists, using the photopolymerizable recording material.

It was surprising that the use of the novel diisocyanate-modified nylons as binders should give photopolymerizable recording materials which have very good overall properties and have a number of special advantages, and which are suitable for the preparation of relief printing plates or photoresists. Because of the good mechanical properties of the diisocyanate-modified nylons in the starting condition, the recording materials have good mechanical properties even before exposure and the performance characteristics of the exposed materials in respect of, for example, resilience and hardness, can be set to the desired order without having, in return, to accept disadvantages, for example poor exposure characteristics, embrittlement or low aging resistance. The exposed materials can be developed in water or aqueous media. Because of the high resolution of the novel recording materials, the relief printing plates prepared therefrom give exact tonal value reproduction, so that they are particularly suitable for reproducing continuous tones. Because of their mechanical properties and in particular because of their good abrasion resistance these plates can be reused many times; their good affinity for ink and good ink release are also of particular advantage.

pieperazine, 1-(2-aminoethyl)-piperazine and N,N'-bis-[3-amino-2,2-dimethylpropyl]-piperazine. ω-Aminocarboxylic acids or lactams, eg. ω-aminocaproic acid, ω-aminoheptanoic acid, ω-aminocaprylic acid, ω-aminolauric acid, ε-caprolactam, α-methyl-ε-caprolactam, ε-methyl-ε-caprolactam and others, can also be used for the preparation of the nylons, provided the terminal carboxyl groups of the nylons thus prepared are subsequently further reacted with a diamine, diol or aminoalcohol.

The nylons having two hydrogen atoms capable of reacting with isocyanates can be prepared by conventional methods. In subsequently preparing the diisocyanate-modified nylons (B1), they can be employed singly or as mixtures with one another. Preferably, nylons which have been prepared from relatively long-chain dicarboxylic acids, for example azelaic acid and/or dodecane-dicarboxylic acid, and piperazine, and which have been provided with amino end groups during preparation by using an excess of piperazine or some other diamine, are employed. In preparing the diisocyanate-modified nylons (B1), the nylons having two hydrogen atoms capable of reacting with isocyanates are employed in such amounts that their final content in the diisocyanate-modified nylon (B1) is from about 15 to 65% by weight, especially from about 20 to 55% by weight. The molecular weight of the nylons having two hydrogen atoms capable of reacting with isocyanates is in general from 500 to 10,000, preferably from 700 to 5,000, determined by the end group method.

Suitable diisocyanates are the conventional compounds known from polyurethane chemistry; they may be employed singly or as mixtures with one another. In principle, any aliphatic, cycloaliphatic, araliphatic, aromatic or heterocyclic diisocyanates can be used. Specific examples are 4,4'-diphenylmethane diisocyanate, dicyclohexylmethane diisocyanate, 1,5-naphthylene diisocyanate, 2,4- and 2,6-toluylene diisocyanate, hexamethylene diisocyanate, isophorone diisocyanate and trimethylhexamethylene diisocyanate. Other suitable diisocyanates include 4,4'-dibenzyl diisocyanate, 1,3- and 1,4-phenylene diisocyanate, cyclohexane 1,4-diisocyanate, xylylene diisocyanates, halogenated diisocyanates, eg. 4-chloro-1,3-phenylene diisocyanate and the hydrogenation products of aromatic diisocyanates, eg. 1,5-tetrahydronaphthylene diisocyanate. In preparing the diisocyanate-modified nylons (B1), the diisocyanates are employed in amounts which correspond to a content, in the diisocyanate-modified nylon, of from 10 to 50% by weight, especially from about 15 to 45% by weight.

The quaternizable nitrogen atoms can be incorporated into the diisocyanate-modified nylons (B1) employed according to the invention by using, in the preparation of the latter, compounds which bear tertiary nitrogen atoms and which should in general be bifunctionally reactive towards isocyanates. Suitable compounds of this type are, in particular, diols containing tertiary nitrogen atoms, but, for example, appropriate diamines or aminoalcohols can also be used. However, in addition to the bifunctional tertiary nitrogen compounds, small amounts of, for example, tertiary nitrogen compounds which are only monofunctionally reactive towards isocyanates can be used in preparing the diisocyanate-modified nylons (B1). The use of higher-functional, for example trifunctional, tertiary nitrogen atoms is less advisable, since it can easily lead to highly branched products.

As tertiary nitrogen compounds which are bifunctionally reactive with isocyanates, it is advantageous to employ appropriate low molecular weight compounds which act as chain extenders. There are, in particular, compounds of the general formulae (I), (II) and (III)

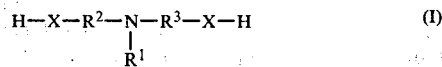

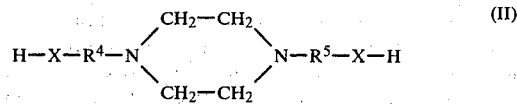

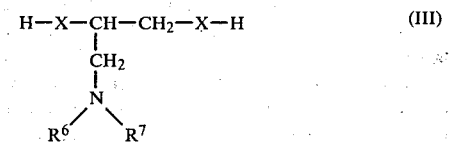

where

X is oxygen, sulfur or —NR—, R being hydrogen or lower alkyl, especially of 1 to 6 carbon atoms, R$^1$ is alkyl, especially of 1 to 6 carbon atoms, cycloalkyl or aryl, R$^2$, R$^3$, R$^4$ and R$^5$ are each straight-chain or branched alkylene or oxa-alkylene, especially of 1 to 6 carbon atoms, or cycloalkylene or phenylene, R$^2$ and R$^3$ may be identical or different, and R$^4$ and R$^5$ may be identical or different, and R$^6$ and R$^7$ are each alkyl, especially of 1 to 6 carbon atoms, cycloalkyl or aryl, or R$^6$ and R$^7$ together are a ring which may or may not contain additional heteroatoms.

In formulae (I) and (II), X is preferably oxygen or —NR—, where R is, in particular, lower alkyl, eg. methyl, ethyl or propyl. R$^1$ is, for example, methyl, ethyl, propyl, isopropyl, butyl or isobutyl, of which the first two are preferred, or is cyclohexyl or phenyl. Examples of R$^2$, R$^3$, R$^4$ and R$^5$ are —CH$_2$—, —CH$_2$—CH$_2$—, —CH$_2$—CH$_2$—CH$_2$—, —CH(CH$_3$)—CH$_2$—, —(CH$_2$)$_4$—, —(CH$_2$—CH$_2$—O)$_n$—CH$_2$—CH$_2$, —(CH(CH$_3$)—CH$_2$—O)$_n$—CH(CH$_3$)—CH$_2$—, where n is an integer, especially 1 or 2, —C$_6$H$_{10}$ or —C$_6$H$_4$—.

In formula (III), X is preferably oxygen. R$^6$ and R$^7$ are each, in particular, lower alkyl, eg. methyl, ethyl or propyl, or cyclohexyl. R$^6$ and R$^7$ can also together form a preferably five-membered or six-membered ring, which can in particular contan N or O as additional hetero-atoms, eg. a piperidine, piperazine or morpholine ring.

Specific examples of tertiary nitrogen compounds of the type of the general formulae (I) and (II) are N-methyldiethanolamine, N-ethyldiethanolamine, N-methyldiisopropanolamine, N-ethyldiisopropanolamine, N-propyldiethanolamine, N-propyldiisopropanolamine, N-isopropyldipropanolamine, N-isopropyldiethanolamine, N,N-bis-(2-hydroxyethyl)-cyclohexylamine, N,N-bis-(2-hydroxyethyl)-aniline, N,N-bis-(2-hydroxyethyl)-toludine, N,N'-bis-(hydroxymethyl)-piperazine, N,N'-bis-(hydroxymethyl)-methylpiperazine, N,N'-bis-(2-hydroxyethyl)-piperazine, N,N'-bis-(2-hydroxyethyl)-2,5-dimethylpiperazine, N,N'-bis-(2-hydroxypropyl)-piperazine, N,N'-bis-(2-hydroxy-2-methylpropyl)-piperazine, N,N'-bis-(hydroxycyclohexyl)-piperazine, N,N'-bis-(hydroxycycloheptyl)-piperazine, N,N'-bis-(hydroxyphenyl)-piperazine, N,N'-bis-(diethoxy)-piperazine, N,N'-bis-(triethoxy)-piperazine and N,N'-bis-(dipropoxy)-piperazine. Advantageous results are also obtained when using corresponding diamine compounds or aminoalcohols, as listed, for example, in German Laid-Open Application DOS No. 2,454,676. Typical examples of compounds of the type of general formula (III) are 1-(N,N-diethyl)-aminopropane-2,3-diol, 1-[N,N-di-(n-propyl)]-aminopropane-2,3-diol, N-morpholinopropane-2,3-diol and N-methyl-N'-piperazinepropane-2,3-diol.

The photopolymerizable double bonds in side branches can be introduced into the diisocyanate-modified nylon (B1), employed according to the invention, by using, in the preparation of the diisocyanate-modified nylon, chain extenders which possess olefinic double bonds in side branches. These may be simple, non-activated double bonds, for example the vinyl group, but activated double bonds, for example acrylic double bonds, are particularly advantageous. Preferably, the double bond is in the terminal position of the side group.

Examples of chain extenders which have non-activated double bonds are but-1-ene-3,4-diol, dimethylolnorbornene and 4,5-dimethylol-cyclohexene. Examples of suitable chain extenders having activated double bonds are unsaturated carboxylic acid ester-diols. These may be, for example, reaction products of dicarboxylic acids with polymerizable olefinically unsaturated glycidyl compounds, such compounds being described, for example, in German Laid-Open Application DOS No. 2,164,386. However, the reaction products of epoxide compounds with polymerizable olefinically unsaturated carboxylic acids are similarly useful. Reaction products of epoxides with α,β-unsaturated monocarboxylic acids, especially acrylic acid and/or methacrylic acid, have proved particularly advantageous. The epoxides can be monoepoxides bearing OH groups, eg. glycidol, but can also be epoxides having two terminal epoxide groups. Particularly preferred products are those which are obtained by reacting acrylic acid and/or methacrylic acid with diepoxides and which have the general formula (IV)

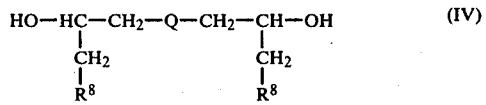

where
R$^8$ is CH$_2$=CR$^9$—CO—O—, R$^9$ being hydrogen or methyl, and
Q is —O—, —O—(CH$_2$)$_m$—O, —O—(CH$_2$—O—)$_n$, —O—(CHCH$_3$—CH$_2$—O—)$_p$, m, n and p being, independently of one another, integers of from 1 to 10, preferably from 1 to 7, or a radical of the general formula (V)

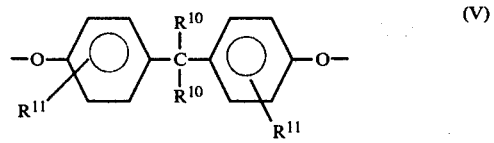

R$^{10}$ and R$^{11}$ being hydrogen or alkyl of 1 to 10 carbon atoms, eg. methyl, ethyl, propyl, butyl or hexyl.

The reaction of the epoxide compound with the polymerizable olefinically unsaturated carboxylic acid is a ring-opening esterification between the epoxide group of the diepoxy compound and the carboxyl group of the carboxylic acid, which can be carried out in a conventional manner, somewhat similarly to that described in German Laid-Open Application DOS 2,164,386 (cf. also U.S. Pat. Nos. 3,373,075 and 2,824,851). The above epoxide compounds and their reaction products can be employed singly or as mixtures with one another. Preferred materials for the purposes of the invention are reaction products of bisphenol-A-diglycidyl ether (e.g. ®Epikote 828 from Shell) or 2,3-epoxypropan-1-ol (glycidol) with acrylic acid and/or methacrylic acid.

The unsaturated carboxylic acid ester-diols, especially the reaction products of acrylic acid and/or methacrylic acid with epoxide compounds, have molecular weights of from 146 to 3,000.

The chain-extending compounds with olefinic double bonds in side branches should be essentially bifunctional in respect of the reaction with the diisocyanates. It may have a functionality greater than 2 in respect of reaction with isocyanate groups, excessive branching of the diisocyanate-modified nylon molecule, or even crosslinking, may occur.

In addition to the compounds mentioned, relatively high molecular weight polydiols and/or other low molecular weight diols, diamines or aminoalcohols, with molecular weights of from 61 to 400, can be employed as chain extenders in the preparation of the diisocyanate-modified nylons (B1) used according to the invention. The use of such additional compounds depends, on the one hand, on the chosen starting compounds and desired molecular weight, but, on the other hand, also on the desired properties of the diisocyanate-modified nylon (B1) and of the recording material. For example, the incorporation of polyether segments, such as results, for example, from the joint use of polyether-diols, leads to soft segments in the diisocyanate-modified nylons (B1).

Suitable relatively high molecular weight polydiols which can be used jointly in the preparation of the diisocyanate-modified nylons (B1) employed according to the invention are the conventional substantially linear polyester-diols, polyether-diols, polylactone-diols and polycarbonate-diols. In addition to the terminal hydroxyl groups, the polydiols may or may not contain small amounts of carboxyl, amino or mercapto groups. The molecular weight of the polydiols is advantageously from 400 to 5,000, preferably from about 500 to 4,000. In preparing the diisocyanate-modified nylons (B1) employed according to the invention, the polydiols are generally used in such amounts that their proportion in the diisocyanate-modified nylon (B1) is less than, or at most equal to, the proportion of nylons having two hydrogen atoms capable of reacting with isocyanates. The content of the said nylons and of the relatively high molecular weight polyols in the diisocyanate-modified nylon (B1) should together be from about 15 to 65% by weight, especially from about 20 to 55% by weight, based on the diisocyanate-modified nylon.

Examples of relatively high molecular weight polydiols, which can be employed individually or as mixtures with one another, are as follows:

Suitable polyester-diols are, in particular, saturated polyester-diols, for example the products obtained by esterifying dicarboxylic acids, especially adipic acid, with C$_2$-C$_{10}$-alkanediols or oxa-alkanediols of 2 to 6 carbon atoms. Specific examples of polyester-diols are adipates of glycol (molecular weight about 2,000), of diethylene glycol (molecular weight about 2,000) of butane-1,4-diol (molecular weight 940), of hexane-1,6-diol (molecular weight 1,000), of a 1:1 hexane-1,6-diol/-butane-1,4-diol mixture (molecular weight 1,000 or 2,000) and of 2,2-dimethylpropane-1,3-diol (molecular weight 1,000). Suitable polycarbonate-diols are, for example, hexanediol polycarbonates. Typical polylactone-diols are polycaprolactone-diols (molecular weight 830 or 2,000). The use of polyether-diols is particularly advantageous; examples of these are polymers of ethylene oxide, propylene oxide, tetrahydrofuran and butylene oxide, copolymers and graft polymers of these compounds, condensates of polyhydric alcohols or of mixtures of such alcohols, and products obtained by oxyalkylation of polyhydric alcohols. Examples of particularly advantageous polyether-diols are polytetrahydrofuran, polyethylene glycol, polypropylene glycol and ethylene oxide/propylene oxide co-polycondensates, in which the proportion of propylene oxide is advantageously from 10 to 90% by weight. Preferably, polydiols containing not less than 5 ether bonds per molecule are employed, as the sole polydiol, or at least as one of the polydiol components.

Additional, low molecular weight, chain extenders which can be used are the conventional saturated or unsaturated glycols, eg. ethylene glycol and its condensates, butane-1,4-diol, propane-1,2-diol, propane-1,3-diol, neopentylglycol, hexane-1,6-diol, decane-1,10-diol, dihydroxyethoxyhydroquinone and butenediol, oxyalkylated aliphatic, cycloaliphatic, aromatic and heterocyclic primary and secondary amines, eg. ethanolamine, N-methylethanolamine, N-butylethanolamine, N-oleylethanolamine, N-cyclohexylisopropanolamine and polyoxyethylated N-butylethanolamine, aliphatic, cycloaliphatic and aromatic diamines, eg. ethylenediamine, hexamethylenediamine, piperazine, cyclohexylene-1,4-diamine, benzidine, diaminodiphenylmethane, 3,3'-dimethyl-4,4'-diaminodicyclohexylmethane and the isomers of phenylenediamine, as well as hydrazine.

The diisocyanate-modified nylons (B1) used according to the invention can be prepared under conventional mass polyaddition or solution polyaddition conditions, as disclosed in the literature. In general, the individual components are employed in a molar ratio of NCO-/OH+NH of from about 0.8 to 1.85, especially from about 0.9 to 1.2.

Advantageously, the diisocyanate-modified nylons are prepared in solution. For this, any desired solvent which does not react with the reaction product or with the reactants can be employed. Preferred solvents are hydrocarbons, halohydrocarbons, ketones, ethers, esters and nitriles, eg. acetone, methyl ethyl ketone, acetonitrile, ethyl acetate, methylene chloride, chloroform, carbon tetrachloride, dimethylformamide, dimethylsulfoxide, tetrahydrofuran, dioxane and t-butanol. Mixtures of these solvents can, of course, also be used. The conventional one-stage or multi-stage methods for the preparation of polyurethanes in solution can be employed.

The polyaddition can be carried out with or without a catalyst. Examples of suitable catalysts are tertiary amines, eg. triethylenediamine, metal salts, eg. calcium acetate, and organic compounds of metals, eg. dibutyltin dilaurate and tin octoate. These catalysts are in particular employed in amounts of from 0.001 to 0.5% by weight, based on polymer.

According to a specific embodiment of the invention, the diisocyanate-modified nylon employed as component (B1) in the photopolymerizable recording material is obtained by reacting an aliphatic, saturated polyamide-diamine with an aliphatic diisocyanate, one or more low molecular weight aliphatic diols (of which from 25 to 100 mole% is but-1-ene-3,4-diol or dimethylolnorbornene) and a tertiary nitrogen compound which is bifunctionally reactive towards isocyanates. The aliphatic saturated polyamide-diamine is one of the type mentioned above, and preferably has a molecular weight of from 400 to 4,000. The aliphatic diisocyanate is, in particular, hexamethylene diisocyanate, and the tertiary nitrogen compound is preferably N-methyldiethanolamine or N,N'-bis-(2-hydroxyethyl)-piperazine. The but-1-ene-3,4-diol or dimethylolnorbornene is preferably used together with but-2-ene-1,4-diol, 2,3-dichloro-but-2-ene-1,4-diol and/or a saturated aliphatic diol of molecular weight not exceeding 200, for example as a mixture with ethylene glycol, propylene glycol, butane-1,3-diol, butane-1,4-diol or neopentylglycol.

According to a particularly preferred embodiment of the invention, component (B1) employed in the photopolymerizable recording material is a diisocyanate-modified nylon which has been prepared by reacting a diisocyanate with a polyamide-diamine, a tertiary nitrogen compound which is bifunctionally reactive towards isocyanates and an acrylic and/or methacrylic acid ester-diol, with or without relatively high molecular weight polydiols and/or additional low molecular weight diols, diamines and/or aminoalcohols employed as chain extenders. Suitable diisocyanates for this reaction are those mentioned earlier, in particular aliphatic and cycloaliphatic diisocyanates, preferred compounds including hexamethylene diisocyanate, isophorone diisocyanate and dicyclohexylmethane diisocyanate. Advantageous nylon components to employ in this reaction are polyamide-diamines obtained from relatively long-chain dicarboxylic acids, for example azelaic acid and dodecanedicarboxylic acid, together with piperazine and with or without smaller amounts of other nylon-forming components. Amongst the tertiary nitrogen compounds which are bifunctionally reactive towards isocyanates, compounds which have proved particularly advantageous for the above reaction are the N-alkyl-diethanolamines, eg. N-methyldiethanolamine and N-ethyldiethanolamine, the N-alkyldiisopropanolamines, eg. N-methyldiisopropanolamine, the dihydroxyalkylenepiperazines, especially N,N'-bis-(2-hydroxyethyl)-piperazine, N,N'-bis-(2-hydroxypropyl)-piperazine, N,N'-bis-(diethoxy)-piperazine, N,N'-bis-(triethoxy)-piperazine and N,N'-bis-(dipropoxy)-piperazine, and reaction products of secondary amines with glycidol, eg. 1-(N,N-diethyl)-aminopropane-2,3-diol. Amongst the acrylic and/or methacrylic acid ester-diols, those of the above general formula (IV) are particularly important, and, amongst these, those where Q has the general formula (V) are preferred. As mentioned above, the reaction products of bisphenol-A-diglycidyl ether (eg. ®Epikote 828 from Shell), of 2,3-epoxypropan-1-ol (glycidol) or of aliphatic diepoxides, eg. butanediol diglycidyl ether, with acrylic acid and/or methacrylic acid are particularly preferred. Advantageous relatively high molecular weight polydiols which may or may not be used in this reaction are the polyetherdiols, especially polyethylene glycol, polypropylene glycol, ethylene oxide/propylene oxide co-polycondensates and polytetrahydrofuran.

As already mentioned, the diisocyanate-modified nylon described can be fully or partially quaternized before use in the photopolymerizable recording materials. They can be employed individually or as mixtures with one another. Component (B1) of the photopolymerizable layer B of the recording material can contain, alongside the diisocyanate-modified nylon described above and employed according to the invention, other, conventional polymeric binders which are compatible with the diisocyanate-modified nylons in question. Examples of such additional binders which may be present alongside the diisocyanate-modified nylons according to the invention in the photopolymerizable layer B are other nylons, polyurethanes and modified or unmodified vinyl alcohol polymers. The diisocyanate-modified nylons employed according to the invention should account for from 60 to 100% by weight of the total binder (component B1). Preferably, the diisocyanate-modified nylons employed according to the invention are used as the sole binder in the photopolymerizable layer B of the recording material.

The photopolymerizable layer B of the recording material contains, in addition to the polymeric binder (component B1), one or more other photopolymerizable ethylenically unsaturated compounds (component B2) and one or more photopolymerization initiators (component B3) with or without other, conventional additives (component B4).

Other suitable photopolymerizable ethylenically unsaturated compounds (component B2) are the conventional low molecular weight monomers and/or oligomers (with molecular weights of up to 5,000, preferably of up to 2,000) usually employed for photopolymerizable recording materials of the type in question. The photopolymerizable ethylenically unsaturated compounds (component B2) should of course be compatible with the polymeric binder (component B1) and should in general boil above 100° C. under atmospheric pressure. The photopolymerizable ethylenically unsaturated compounds (component B2) can be monofunctional or polyfunctional, ie. they can possess one or more carbon-carbon double bonds capable of photoinitiated polymerization. The photopolymerizable ethylenically unsaturated compounds (component B2) can be employed singly or as mixtures with one another. For example, the photopolymerizable recording material can contain one or more monofunctional compounds or one or more polyfunctional compounds of this type; for certain applications, it is advantageous to use, as component (B2), a combination of monofunctional and polyfunctional, especially of monofunctional and bifunctional, photopolymerizable ethylenically unsaturated compounds. The nature and amount of the photopolymerizable ethylenically unsaturated compounds employed (component B2) of course depends on the polymeric binder (component B1) used with them, and in particular on the nature and end use of the photopolymerizable recording material, ie. on its desired pattern of properties. For example, polyfunctional rapidly crosslinking photopolymerizable ethylenically unsaturated compounds are advantageously used as component (B2) when preparing relief printing plates for newspaper printing and for jobbing work.

The ratio of the polymeric binder (component B1) to the other photopolymerizable ethylenically unsaturated compounds (component B2) in the photopolymerizable layer B can be varied within wide limits. In general, from about 97 to 40% by weight of polymeric binder (component B1) and from 3 to 60% by weight of photopolymerizable ethylenically unsaturated compounds (component B2) are used. Preferably the proportions are from about 95 to 60% by weight of polymeric binder (component B1) and from 5 to 40% by weight of photopolymerizable ethylenically unsaturated compounds (component B2), these percentages being based on the sum of components (B1) and (B2). If component (B2) is a mixture of monofunctional and polyfunctional photopolymerizable ethylenically unsaturated compounds, the proportion of the monofunctional photopolymerizable ethylenically unsaturated compounds therein is in general from 5 to 70% by weight.

Suitable photopolymerizable ethylenically unsaturated compounds which can be employed as component (B2) in the novel photopolymerizable recording materials are described, inter alia, in U.S. Pat. Nos. 2,760,863 and 3,060,203. Examples of suitable compounds are allyl esters of carboxylic acids, eg. allyl acrylate and diallyl phthalate, vinyl esters of aliphatic monocarboxylic acids, eg. vinyl acetate, vinyl butyrate and vinyl oleate, and vinyl ethers of alcohols, eg. octadecylvinyl ether and butane-1,4-diol divinyl ether. Advantageous compounds to use are derivatives, for example esters or amides, of unsaturated carboxylic acids, for example derivatives of maleic acid and especially derivatives of acrylic acid or methacrylic acid. Specific examples of maleic acid derivatives are the dialkyl maleates, where alkyl is of 1 to 4 carbon atoms. Particularly preferred compounds are monofunctional and polyfunctional derivatives of acrylic acid and methacrylic acid, including, in particular, the acids themselves, acrylamide, methacrylamide, the N-hydroxyalkylacrylamides and N-hydroxyalkylmethacrylamides, where alkyl is of 1 to 6 carbon atoms, eg. N-hydroxymethylacrylamide, N-hydroxymethylmethacrylamide, N-hydroxyethylacrylamide and N-hydroxyethylmethacrylamide, derivatives and reaction products of these acrylamides and methacrylamides, and, in particular, the acrylic acid esters and methacrylic acid esters of monoalcohols, dialcohols and polyalcohols. Specific examples of the acrylates and methacrylates are those of alkanols of 1 to 6 carbon atoms, eg. methyl acrylate, methyl methacrylate, ethyl acrylate, ethyl methacrylate, propyl acrylate, propyl methacrylate, butyl acrylate, butyl methacrylate and hexyl methacrylate, the diacrylates, polyacrylates, dimethacrylates and polymethacrylates obtained by esterifying diols or polyols with acrylic acid or methacrylic acid, for example the diacrylates, dimethacrylates, triacrylates and trimethacrylates of ethylene glycol, diethylene glycol, triethylene glycol, polyethylene glycol of molecular weight up to about 500, propane-1,2-diol, propane-1,3-diol, neopentylglycol(2,2-dimethylpropanediol), butane-1,4-diol, 1,1,1-trimethylolpropane, glycerol or pentaerythritol, and the monoacrylates and monomethacrylates of such diols and polyols, for example of ethylene glycol, diethylene glycol, triethylene glycol and tetraethylene glycol. Further suitable materials are low molecular weight prepolymeric urethane-acrylates, such as can be prepared, for example, by reacting hydroxyalkyl acrylates or methacrylates (eg. $\beta$-hydroxyethyl acrylate or methacrylate, $\beta$-hydroxypropyl acrylate or methacrylate or butanediol monoacrylate or monomethacrylate), aliphatic diols (for example of the above type) and organic diisocyanates (for example hexamethylene diisocyanate or isophorone diisocyanate). Such low molecular weight prepolymeric urethane-acrylates, which preferably have a molecular weight of less than 5,000, especially of from 500 to 3,000, are described, for example, in German Laid-Open Application DOS No. 1,644,797. For the preparation of recording materials which are developable in water or aqueous media, the water-soluble monomers and/or oligomers are particularly preferred.

Suitable photopolymerizable initiators (component B3) are the conventional compounds and systems for initiating a photopolymerization reaction on exposure to actinic light, such as have been adequately described in the relevant literature. Preferred initiators are those which are thermally inactive below 120° C., preferably below 185° C. The photoinitiators must be dispersed in the photopolymerizable layer B in the amount required to trigger the desired polymerization or crosslinking under the influence of actinic radiation.

Examples of photoinitiators are acyloins and their derivatives, such as benzoin, benzoin alkyl ethers, α-methylolbenzoin and its ethers and α-methylbenzoin, vicinal diketones and their derivatives, for example diacetyl, benzil, benzil ketals, eg. benzil dimethyl ketal, benzil methyl ethyl ketal, benzil methyl benzyl ketal, benzil methyl allyl ketal and benzil ethylene glycol monoketal, unsubstituted and substituted quinones, eg. anthraquinone and benzanthraquinone, benzophenone and 4,4'-bis-(dimethylamino)-benzophenone and, in particular, acylphosphine oxide compounds of the type described, for example, in German Laid-Open Application DOS No. 2,909,992.

The photopolymerization initiators can be used individually or as mixtures with one another. The amounts used are those required to initiate the photopolymerization. Depending on the extinction coefficient of the initiator, the thickness of the photopolymerization layer of the recording material, etc., the amount of photopolymerization initiator employed is in general from 0.02 to 5% by weight, preferably from 0.1 to 3% by weight, based on the sum of all components of the photopolymerizable layer B. The photopolymerization initiators can also be used in conjunction with co-initiators or activators. For example, initiator systems comprising benzoin methyl ether and triphenylphosphine, or comprising 4,4'-bis-(dimethylamino)-benzophenone and a halohydrocarbon (cf. German Laid-Open Application DOS No. 2,759,164) or comprising acylphosphine oxide compounds and tertiary amines, eg. methyldiethanolamine, dimethylethanolamine or triethanolamine (cf. German Laid-Open Application DOS No. 2,909,992) can be used. For such initiator systems, the total concentration of photoinitiator+activator is 0.05 to 8% by weight, preferably 0.5 to 5% by weight, based on the photopolymerizable layer B.

In addition to the polymeric binder (component B1), the other photopolymerizable ethylenically unsaturated compounds (component B2) and the photopolymerization initiators (component B3), the photopolymerizable layer B of the novel recording material may, as an additional component (B4), contain conventional amounts of the usual additives. These include, in particular, thermal polymerization inhibitors, inorganic or organic pigments or dyes, inorganic or organic fillers, plasticizers, dulling agents and lubricants, etc..

Suitable polymerization inhibitors are the conventional compounds used to prevent thermal polymerization, for example hydroquinone, p-methoxyphenol, p-quinone, copper-I chloride, methylene blue, β-naphthol, phenols, m-dinitrobenzene, N-nitrosoamines, eg. N-nitrosodiphenylamine, phenothiazines, esters of phosphorous acid, eg. triphenyl phosphite, or salts of N-nitrosocyclohexyl-hydroxylamine. A precondition which such inhibitors have to meet is that they do not possess a significant intrinsic absorption in the actinic range in which the photoinitiator, used at the same time, absorbs. The polymerization inhibitors are in general employed in amounts of from 0.001 to 2.0% by weight, preferably from 0.005 to 0.5% by weight, based on the sum of all components of the photopolymerizable layer B.

The layer B can moreover contain dyes or photochromic additives for controlling the exposure characteristics of the novel recording material. Dyes and pigments may also be added for identification purposes or aesthetic purposes, provided that they do not excessively absorb the actinic radiation and that they do not interfere with the photopolymerization reaction.

The photopolymerizable layer B can moreover contain further additives, for example compatible plasticizers, waxes, saturated low molecular weight compounds having amide groups, etc., by means of which specific properties, depending on the particular end use, can be obtained or improved. For example, the addition of certain amounts of plasticizers to the photopolymerizable layer B results in flexible and resilient layers which exhibit good recovery, so that the addition of such plasticizers is particularly advisable in the case of photopolymerizable recording materials which are to be employed, for example, for the preparation of flexible and resilient relief printing plates or of photoresists. The addition of other materials, for example certain polymers or fillers, can be used, on the other hand, to increase the hardness of the exposed layers. Suitable plasticizers are the compounds conventionally used for this purpose, for example phthalic acid esters, paraffin oils or liquid polybutadiene compounds. The photopolymerizable layer B can in general contain from 5 to 50% by weight of plasticizers, based on the sum of all components in layer B.

The resistance of the photopolymerizable recording materials to oxygen and ozone can, if necessary, be improved by adding to the photopolymerizable layer B suitable amounts of compatible conventional antioxidants and/or anti-ozone agents.

Suitable bases A for the novel photopolymerizable recording materials are the conventional bases which have sufficiently high dimensional stability. They include metal sheets made of, for example, steel or aluminum foils of copper and the like, as well as films of high polymers, for example of polyethylene terephthalate, polybutylene terephthalate, nylon or polycarbonate. It is also possible to use a woven or nonwoven fabric, such as a glass fiber fabric, as base A.

The choice of a suitable base A depends, in particular, on the end use of the photopolymerizable recording material. For example, to prepare photoresists it is preferred to use bases which are particularly easily etched or electroplated. For the preparation of relief printing plates, the bases used are, in general, metal plates or plastic films.

The novel photopolymerizable recording materials are prepared in a conventional manner by preparing the individual layers and bonding them together. To prepare the photopolymerizable layer B, the individual components (B1), (B2) and (B3), with or without (B4), are homogeneously mixed by conventional methods and the mixture is processed into layers of the desired thickness. The homogeneous, essentially non-lightscattering mixtures of the individual components of layer B can be prepared by conventional kneading, mixing and dissolving methods. The photopolymerizable layer B can then be produced, for example, by coating the appropriate base with a solution of the mixture in a suitable solvent (for example tetrahydrofuran). The photopolymerizable layer B can also be produced by pressing, calendering or extruding the mixture, and if the inhibitors have been appropriately chosen there is no danger of incipient thermal polymerization as a result of such treatment.

As a result of the presence of the diisocyanate-modified nylons (B1) employed according to the invention, the mixtures of components of layer B, and the photopolymerizable layers produced therefrom, are very easy to handle and exhibit very good processability.

To prepare the photopolymerizable recording materials, it is possible either to laminate or press a prefabricated photopolymerizable layer B onto the base A or, as mentioned, to apply a mixture of components constituting the polymerizable layer B to the base A in a suitable manner, for example by applying a layer of a solution, thereby forming the desired thickness of layer B on the base.

Depending on the materials employed, it may be advantageous and/or necessary to anchor the photopolymerizable layer B to the base A by means of an adhesive layer, about 0.5 to 40 $\mu$m thick, which may consist of a commercial one-component or two-component adhesive, the nature of which depends on the base material and on the materials constituting the photopolymerizable layer B. Adhesives which often prove suitable include commercial reactive polyurethane-based or polychloroprene-based adhesives, a suitable amount of which can be applied, by coating or casting, to the layers to be bonded.

It is often advantageous if, in the photopolymerizable recording material, a firmly adhering thin non-tacky top layer C is applied to the surface of the photopolymerizable layer B which faces away from the base. Such a layer C preferably consists of a polymer which forms hard, non-tacky, transparent and tear-resistant films. Since the photopolymerizable recording material is exposed through this layer and the latter is removed only on subsequent development of the relief image by washing out the unexposed areas with the developer solution, the top layer C should consist of a polymer which is soluble in the developer solution. Since it is advantageous to use water or an aqueous medium to wash out the photopolymerizable layer B of the novel recording material after exposure, the top layer C, the thickness of which is in general from about 0.1 to 20 $\mu$m, advantageously from about 0.5 to 5 $\mu$m, depending on the end use of the recording material, should also be soluble in water or the aqueous medium employed. Examples of polymers which can be employed to prepare the top layer C include soluble nylons and nylon copolymers, polyurethanes, polyvinyl alcohol and its partial esters, ethers and acetals, gelatin, polyvinylpyrrolidones, polyethylene oxides of molecular weight greater than 100,000, etc. The firmly bonded top layer C makes it possible, for example, to place the negative on the recording material, for exposure, without causing it to adhere thereto and without the formation of air bubbles; moreover, layer C prevents access of oxygen—which inhibits photopolymerization—to the photopolymerizable layer B.

It is moreover often advantageous to provide the photopolymerizable recording materials with a strippable cover sheet; the latter can be applied directly to the photopolymerizable layer B or be used together with the abovementioned firmly bonded top layer C. The cover sheet, which can consist, for example, of nylon or a polyester, such as polyethylene terephthalate or polybutylene terephthalate, and which is advantageously from about 20 to 150 $\mu$m thick, is in general peeled off before imagewise exposure of the recording material; however, if the cover sheet is sufficiently transparent, exposure can also take place through the latter, after which the sheet is peeled off before development of the exposed material.

Because of the diisocyanate-modified nylon binder (component B1) employed according to the invention, the photopolymerizable recording materials exhibit not only easy processability but also good handling characteristics. They have a reduced skin toxicity and contact toxicity; they are relatively heat-stable and can be stored satisfactorily even for prolonged periods, without the occurrence to any great extent of adverse changes due to, for example, aging, embrittlement or cold flow. The photopolymerizable recording materials of the invention have very good exposure characteristics, e.g. they are easily and rapidly crosslinked. Because of the good mechanical properties of the diisocyanate-modified nylons employed in component (B1), the novel photopolymerizable recording materials are easily processed into printing plates having the desired properties. For example, it is easy to prepare photopolymerizable recording materials whose layer B, after exposure, has a Shore A hardness (DIN 53,505) of from 55 to 99, such as is desirable, for example, for the preparation of relief printing plates.

The photopolymerizable recording materials of the present invention are particularly suitable for photochemical information fixing by imagewise exposure of the photopolymerizable layer B and subsequent removal of the unexposed, non-crosslinked areas of the layer, especially by conventional washing-out with a developer solution. The thickness of the photopolymerizable layer B and the particular structure of the photopolymerizable recording material depend on the particular end use. Whilst in general the thickness of the photopolymerizable layer B can easily be varied between 0.005 and 6.5 mm, the thickness employed for preparing photoresists, for example, is from 10 to 50 $\mu$m. For the preparation of relief printing plates, the thickness of the photopolymerizable layer B is generally from several 100 $\mu$m to several mm. To prepare printing plates with relief-forming layers 3.0–6.5 mm thick it is also possible, for example, to prepare the photopolymerizable layer B by laminating individual layers of photopolymerizable mixtures, if necessary using a solvent which produces superficial dissolution of the layers being combined. To achieve specific printing properties, layers of different hardness and different composition can be employed.

The photopolymerizable recording material can be exposed using flat-plate or rotary exposure units. Suitable sources of light which initiates the photopolymerization or photocrosslinking are commercial actinic light sources, eg. ultraviolet fluorescent tubes, mercury medium pressure, high pressure and low pressure lamps, superactinic fluorescent tubes, pulsed xenon lamps, metal iodide doped lamps, carbon arc lamps, etc. The light emitted by the radiation sources should have a wavelength of from 230 to 450 nm. Preferably, the wavelength should be from 300 to 420 nm and be matched to the intrinsic absorption of the photoinitiator contained in the photopolymerizable layer B.

Organic solvents, for example ketones, dimethylformamide, N-methylpyrrolidone, etc., can be employed as developer solutions for washing out the unexposed, noncrosslinked areas of layer B after imagewise exposure of the recording materials. Preferably, however, water or an aqueous medium is used to develop the plates. Aqueous media, for the purposes of the present invention, mean, quite generally, both aqueous solutions and mixtures of water with the organic solvents mentioned above, the mixtures being non-flammable and capable of being handled without special precautionary measures. Aqueous solutions may contain, for example, protonating agents, eg. hydrochloric acid, sulfuric acid, formic acid or acetic acid, in order to increase the rate of washing out if the diisocyanate-modified nylon (component B1) still contains quaternizable nitrogen atoms. The mixtures of water and organic solvents which fall under the category of aqueous media discussed above, include, for example, alcohol/water mixtures containing up to 90% by volume of alcohol, examples of suitable alcohols being methanol, ethanol, isopropanol, etc.

After washing out with the developer solution, the resulting relief plates, eg. relief printing plates or photoresists, are dried in a conventional manner, preferably at up to 80° C. In some cases it is advantageous to post-expose the resulting relief plates to actinic light in order to increase their strength.

The printing plates prepared according to the invention can be employed for all types of printing processes. The novel recording materials can be used particularly advantageously for the preparation of relief printing plates especially suitable for newspaper printing and for jobbing work. In such cases, the photopolymeric relief-forming layer B should, after exposure, advantageously have a Shore hardness (DIN No. 53,505) of 55–99, preferably of 60–95.

Photoresists can be prepared from the novel photopolymerizable recording materials, using the laminating process described, for example, in German Published Applications DAS No. 1,522,515 and DAS No. 2,123,702. The photoresists can be used in a conventional manner for electroplating or electroless metal coating, for etching, and for engraving, for example in the production of printed circuits, integrated circuits, silk-screens, etc.

A great and unexpected advantage of the novel recording materials is that in addition to having good properties in the unexposed state and on exposure, they also have excellent properties after exposure and development. For example, when they are processed into relief printing plates, improved relief images are obtained which, on printing, results, for example, in a markedly improved reproduction of typographical reverses. Another surprising characteristic is the high resolution, which makes possible precise reproduction of tonal values. Relief printing plates prepared from the novel recording materials have good affinity for ink and good ink release characteristics and exhibit only slight swelling when exposed to the solvents employed in printing inks. In addition to their other advantageous mechanical properties, the plates have high abrasion resistance, so that long runs can be printed with a single plate. The plates can also be reused a large number of times.

The Example which follows illustrates the invention. Parts and percentages are by weight, unless stated otherwise. Parts by volume bear the same relation to parts by weight as the liter to the kilogram. The viscosity quoted was determined under the experimental conditions stated. The K value quoted was measured in a 1% strength solution in dimethylformamide.

EXAMPLE (a) Preparation of the diisocyanate-modified nylon 438 g of a 68.9% strength acetone solution of the diacrylate of bisphenol A diglycidyl ether (®Epikote 828 from Shell), 100 g of methylpiperazine and 266 g of tetrahydrofuran are stirred for 8 hours at 50° C. 359 g of this reaction product are stirred with 100 g of a polyester (OH number 56), consisting of polycarbonate and butane-1,4-diol, 104 g of isophorone diisocyanate and 204 g of acetone at 50° C., until the NCO content is 1.3%. 93.3 g of a nylon copolymer having terminal amino groups and prepared from dodecanedicarboxylic acid, azelaic acid, piperazine and hexamethylenediamine adipate are then added, as a 30% strength solution in tert.-butanol. After completion of the thermal reaction, 4,4'-diamino-3,3'-dimethyl-di-cyclohexylmethane is added dropwise until the viscosity is about 200 mPa.s/50° C. 25 g of methanol and 60 g of acetic acid are then added. The product obtained has a K value of 36.

(b) Preparation of a printing plate 25 parts of bis-N-methylolacrylamide ethylene glycol ether, 1.5 parts of benzoin methyl ether and 0.3 part of hydroquinone are added to 100 parts of a 35% strength aqueous acetic acid solution (pH 5) of the diisocyanate-modified nylon. The solution obtained is cast on a metal sheet or polyester film and the solvent is evaporated off. An 0.7 mm thick transparent photosensitive layer is obtained. A negative is placed on this layer and exposure is effected for 5 minutes, using an ultraviolet tube unit for exposing photopolymer printing plates. The negative is removed, and the plate is washed out with neutral water in a spray washer, after which it is dried. The relief printing plate obtained gives excellent printed copies.

We claim:

1. A photopolymerizable recording material for the preparation of relief printing plates and photoresists comprising a base A and a photopolymerizable layer B, the photopolymerizable layer B comprising
   (1) as the polymeric binder (B1), a substantially linear, high molecular weight, thermoplastic diisocyanate-modified nylon having a K value of from about 30 to 75 and which contains from 0.2 to 2.5% by weight based on the weight of the diisocyanate-modified nylon of quaternary and/or quaternizable nitrogen atoms and also contains from 0.01 to 2.5% by weight based on the weight of the diisocyanate-modified nylon of photopolymerizable double bonds in side branches, wherein said component (B1) has been prepared by reacting a nylon having two hydrogen atoms capable of reacting with isocyanates, with a diisocyanate, a tertiary nitrogen compound which is bifunctionally reactive with isocyanates, and a chain extender compound which has two hydrogen atoms capable of reacting with isocyanates and possesses olefinic double bonds in side branches, which chain extender compound is the reaction product of glycidol with acrylic or methacrylic acid or has the formula

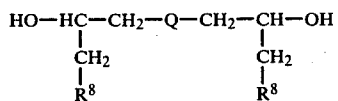

where
R[8] is $CH_2=CR^9-CO-O-$, $R^9$ being hydrogen or methyl, and
Q is $-O-$, $-O-(CH_2)_m-O$, $-O-(CH_2-CH_2-O-)_n$, $-O-(CHCH_3-CH_2-O-)_p$, m, n and p being, independently of one another, integers of from 1 to 10, or a radical of the formula (V)

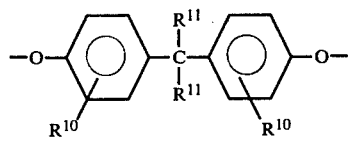

$R^{10}$ and $R^{11}$ being hydrogen or alkyl of 1 to 10 carbon atoms, said compounds of the formula IV haviing a molecular weight of from 143–3,000, with or without other low molecular weight chain extenders, (2) at least one additional photopolymerizable ethylenically unsaturated compound and (3) a photopolymerization initiator.

2. A photopolymerizable recording material as set forth in claim 1, wherein the epoxides of formula IV are derived from bisphenol-A-diglycidyl ether.

3. A photopolymerizable recording material as set forth in claim 1, wherein the diisocyanate-modified nylon used as component (B1) has a softening point above 35° C.

4. A photopolymerizable recording material as set forth in claim 1, wherein the diisocyanate-modified nylon used as component (B1) has been prepared by reacting the individual components in a ratio which corresponds to an NCO/OH+NH molar ratio of from about 0.8 to 1.85, especially from about 0.9 to 1.2.

5. A photopolymerizable recording material as set forth in claim 1, wherein the photopolymerizable layer B additionally carries a top layer and/or cover sheet C.

* * * * *